(12) United States Patent
Mutzel et al.

(10) Patent No.: US 10,131,127 B2
(45) Date of Patent: Nov. 20, 2018

(54) PAINT-ON APPROACH FOR FABRICATION OF ELECTRICALLY ACTIVE STRUCTURES

(71) Applicant: Tufts University, Medford, MA (US)

(72) Inventors: Chris Mutzel, Seattle, WA (US); Sameer Sonkusale, Arlington, MA (US)

(73) Assignee: Tufts University, Medford, MA (US)

( * ) Notice: Subject to any disclaimer, the term of this patent is extended or adjusted under 35 U.S.C. 154(b) by 150 days.

(21) Appl. No.: 14/408,091

(22) PCT Filed: Jun. 14, 2013

(86) PCT No.: PCT/US2013/045804
§ 371 (c)(1),
(2) Date: Dec. 15, 2014

(87) PCT Pub. No.: WO2014/035528
PCT Pub. Date: Mar. 6, 2014

(65) Prior Publication Data
US 2015/0151525 A1   Jun. 4, 2015

Related U.S. Application Data

(60) Provisional application No. 61/660,367, filed on Jun. 15, 2012.

(51) Int. Cl.
*H01F 7/06* (2006.01)
*B32B 38/10* (2006.01)
(Continued)

(52) U.S. Cl.
CPC .............. *B32B 37/14* (2013.01); *B32B 38/10* (2013.01); *B32B 38/145* (2013.01); *H01F 7/06* (2013.01); *H01Q 15/0086* (2013.01); *H05K 1/0236* (2013.01); *H05K 3/1225* (2013.01); *B32B 2307/204* (2013.01); *B32B 2307/208* (2013.01); *B32B 2457/00* (2013.01);
(Continued)

(58) Field of Classification Search
None
See application file for complete search history.

(56) References Cited

U.S. PATENT DOCUMENTS

| | | | |
|---|---|---|---|
| 6,522,308 B1 | 2/2003 | Mathieu | |
| 2004/0116596 A1* | 6/2004 | Vincent | C08K 5/005 524/775 |

(Continued)

FOREIGN PATENT DOCUMENTS

| | | |
|---|---|---|
| CA | 2703702 | 5/2009 |
| EA | 200802317 | 4/2009 |

(Continued)

OTHER PUBLICATIONS

Slyusar, "Metamaterialy v antennoy tekhnike: osnovnye printsipy i rezultaty." (2010).

*Primary Examiner* — Laura C Powers
(74) *Attorney, Agent, or Firm* — Occhiuti & Rohlicek LLP

(57) ABSTRACT

A method of making an electrically active structure includes applying a backplane onto a substrate, applying a paint layer onto said backplane, applying a stencil layer on said paint layer, patterning an electrically active structure onto said paint layer through said stencil layer, and removing said stencil layer.

15 Claims, 4 Drawing Sheets

(51) Int. Cl.
*B32B 38/00* (2006.01)
*H05K 3/12* (2006.01)
*H01Q 15/00* (2006.01)
*H05K 1/02* (2006.01)
*B32B 37/14* (2006.01)

(52) U.S. Cl.
CPC ....... *H05K 1/024* (2013.01); *Y10T 428/24628* (2015.01); *Y10T 428/24802* (2015.01); *Y10T 428/31855* (2015.04)

(56) References Cited

U.S. PATENT DOCUMENTS

| | | | | |
|---|---|---|---|---|
| 2005/0287711 | A1* | 12/2005 | Huang | H01L 23/49861 438/123 |
| 2006/0001726 | A1* | 1/2006 | Kodas | C23C 18/06 347/105 |
| 2008/0182085 | A1* | 7/2008 | Oyanagi | C09D 11/36 428/195.1 |
| 2010/0073254 | A1* | 3/2010 | Lee | H01Q 9/42 343/860 |
| 2011/0198712 | A1* | 8/2011 | Okumura | G01L 1/205 257/415 |
| 2012/0031656 | A1* | 2/2012 | Oka | C23C 28/00 174/257 |
| 2013/0011639 | A1* | 1/2013 | Nakajima | C09C 1/62 428/195.1 |

FOREIGN PATENT DOCUMENTS

| | | | |
|---|---|---|---|
| JP | WO 2011122629 A1 * | 10/2011 | ............... C09C 1/62 |
| RU | 2091879 | 9/1997 | |
| RU | 2155420 | 8/2000 | |
| RU | 2258282 | 8/2005 | |
| RU | 2309494 | 10/2007 | |
| RU | 2341377 | 12/2008 | |
| RU | 2388774 | 4/2009 | |

* cited by examiner

PAINT-ON APPROACH FOR FABRICATION OF ELECTRICALLY ACTIVE STRUCTURES

RELATED APPLICATIONS

This application is the national phase under 35 USC 371 of International Application PCT/US2013/045804, filed Jun. 14, 2013, which claims the benefit of the Jun. 15, 2012 priority date of U.S. Provisional Application 61/660,367, the contents of which are herein incorporated by reference.

GOVERNMENT LICENSE RIGHTS

This invention was made with government support under grant 1002152 awarded by the National Science Foundation. The government has certain rights in the invention.

FIELD OF DISCLOSURE

This disclosure relates to an approach for fabricating devices, including electromagnetic structures like antennas and metamaterials to perform real-time control of electromagnetic wave propagation, reception and emission, and sensors, circuits, or devices that might otherwise be microfabricated or printed.

BACKGROUND

Electromagnetic metamaterials for supporting propagation of a particular wavelength consist of composites having a patterned metallic structure having dimensions on the order of the wavelength to be propagated. The interaction of these metallic structures with the surrounding medium results in a wave propagation medium that can have negative values of permittivity and/or permeability. These materials can thus be used to control reflectivity and absorptivity.

Metamaterials are typically made on stiff substrates requiring expensive chemicals and components. The fabrication process for these meta materials often involves maintaining strict environmental controls during the fabrication process. This tends to limit their applications. Moreover metamaterials cannot be made on arbitrary substrates like glass, wood, polymers etc.

Antennas are common structures used in wireless communication, radio, and even energy harvesting applications. As a result, methods for pattern antennas on arbitrary substrates are useful.

SUMMARY

The invention is based on the recognition of a novel method for manufacturing electrically active structures as an alternative to traditional methods of micro-fabrication and printing. Electrically active structures that can be made using the methods described herein include metamaterials, antennas, sensors, devices, and all manner of circuits. Using the methods described herein, these structures can be made using inexpensive materials and processes. The method disclosed herein enables coating arbitrarily-shaped surfaces with metamaterials and antennas or other electromagnetic coupling structures. Such surfaces can be found on, for example, motor vehicles, airplanes, drones, ships, missiles, and the like.

In one aspect, the invention includes a method of making an electrically active structure, which can include metamerials, antennas, sensors and various electrical circuits. The method includes building a paint layer on a substrate. The paint layer can be made of a dielectric paint or a metallic paint. Examples of metallic paint include colloidal silver conductive ink, gold nanoparticle solution, nickel or tin colloidal particle solution, silver paste or any other metal nanoparticle ink or paste. In some practices, one alternates between dielectric and metallic paints to create arbitrary layered metal-dielectric structures. A stencil is then interposed between paint layers to pattern the paint, whether dielectric or metallic, with desired shapes and geometries. Examples of stencils include stencils made of cellulose, including paper. Examples of dielectric paint are water-based paint, including latex paint, oil based paint, and any polymer that can be applied with a brush.

In another aspect, the invention includes a method of making an electrically active structure. The method includes applying a paint layer between a backplane and a stencil, and patterning on the stencil. Examples of stencils include cellulose or polymeric stencils, including paper.

In some practices of the method, applying the paint layer includes applying a latex paint layer and allowing it to dry. Repeated application of paints can achieve any desired thickness. One can achieve thickness in the range of micrometers to millimeters suitable for millimeter wave and microwave frequency range.

Practices of the method also include those in which patterning includes applying a conductive ink according to a specified pattern onto the paper layer, those in which patterning includes applying silver ink to the paper layer, those in which patterning includes forming a crossed-dipole, those in which patterning includes forming an electrically active element, those in which patterning includes forming a polarization-insensitive structure, and those in which patterning includes forming a polarization-sensitive structure.

Other practices include those in which patterning includes applying a conductive ink to patterned paper layer with patterns of metamaterial or antenna in the form of stencils through which one applies silver or metallic ink to the paper layer, those in which patterning includes any metamaterial geometry, including without limitation crossed dipoles, split ring resonators, electrical split ring resonators, double electric split ring resonators, bow tie antennas, coils, spiral antennas, log periodic antennas, those in which patterning includes forming an electrically active element, and those in which patterning includes forming an electrically active element that could be made polarization insensitive or sensitive.

In another aspect, the invention features a method of making a metamaterial. Such a method includes applying a conductive backplane onto a substrate, building a first paint layer on the backplane, applying a stencil on the first paint layer, patterning electrically active elements onto the first paint layer through the stencil, and removing the stencil.

In some practices, building the first paint layer comprises building a latex paint layer. However, in other practices, building the first paint layer comprises building an oil-based paint layer.

Practices of the invention vary in how thick the paint layer is. In some practices, building the first paint layer comprises building a paint layer having a thickness of approximately one millimeter. However, in others, building the first paint layer comprises building a paint layer having a thickness between one micrometer and one millimeter.

The procedure for building the paint layer can include application of multiple coats. In one practice, building the first paint layer comprises applying a first coat of paint, waiting for the first coat to dry, and applying a second coat of paint on the first coat. In another practice, building the first paint layer comprises applying a plurality of coats of paint.

Also included within the scope of the invention are those practices that include building a second paint layer on the first paint layer. Among these are practices that include, prior to building the second paint layer, patterning electrically active structures onto the first paint layer through the stencil, removing the stencil from the first paint layer, and building the second paint layer on top of the patterned first paint layer. In some cases, the first paint layer is conductive and the second paint layer is dielectric, but in others, the first paint layer is dielectric and the second paint layer is conductive.

The invention also includes, in at least some practices of the method, mixing a reinforcing agent into paint used to build the first paint layer. For example, one can mix shredded paper into paint used to build the first paint layer.

Practices of the invention differ in the result of patterning. For example, in some practices, patterning electrically active elements comprises applying a conductive ink onto the stencil layer. Other practices include those in which patterning electrically active elements comprises applying silver ink to the stencil layer, forming a crossed-dipole, forming a split-ring, and forming a log periodic structure, forming a spiral structure, forming a polarization-insensitive electrically active elements, and forming a polarization-sensitive electrically active structure.

Practices of the invention also differ in the type of stencil used. In some practices, the stencil comprises paper, such as ordinary copy paper, whereas in others, the stencil comprises cloth. In yet others, the stencil comprises polymer like PMMA (poly methyl methacrylate). In yet others, the stencil comprises glass or silicon.

Alternate practices of the invention include removing the substrate.

In some practices, the electrically active structure includes a metamaterial. These practices include applying the metamaterial. These include applying the metamaterial to a curved surface, such as one found on an automobile, or other vehicle, on aircraft, and on ships, missiles, or drones.

In another aspect, the invention features a manufacture including an electrically active structure having a layer of paint.

In some embodiments, the electrically active structure further includes a layer of paper adjacent to the layer of paint. Among these embodiments are those that further include a conductive patterned structure on the layer of paper. Examples of such patterned structures include crossed dipoles, and polarization-insensitive patterned structures.

Embodiments also include those that further include a motor vehicle on which the electromagnetic metamaterial is applied, an aircraft on which the electromagnetic metamaterial is applied, a drone on which the electromagnetic metamaterial is applied, a missile on which the electromagnetic metamaterial is applied, and a curved surface on which the electromagnetic metamaterial is applied.

In some embodiments, the paint layer includes a water-based paint such as a latex paint. In others, the paint layer includes an oil-based paint.

In other embodiments, the electrically active structure includes silver ink. However, other inks can also be used, including but not limited to carbon ink, gold nanoparticle ink, nickel ink, or ink and pastes containing other metallic particles.

Embodiments of the invention include those in which the electrically active structure includes a metamaterial is tuned to absorb and/or otherwise interact with millimeter waves, microwaves including, for example, in L, C, S, X, Ku, K, Ka, Q, U, V, E, W, F, and D bands, radio frequency waves, terahertz waves, and far infrared waves. Conceptually, the invention is electromagnetically scalable. Hence, embodiments can be made to interact with electromagnetic waves in any band from the kilohertz range to the terahertz range.

These and other features and advantages of the invention will be apparent from the following detailed description and the accompanying figures, in which:

DETAILED DESCRIPTION

Figure 1:
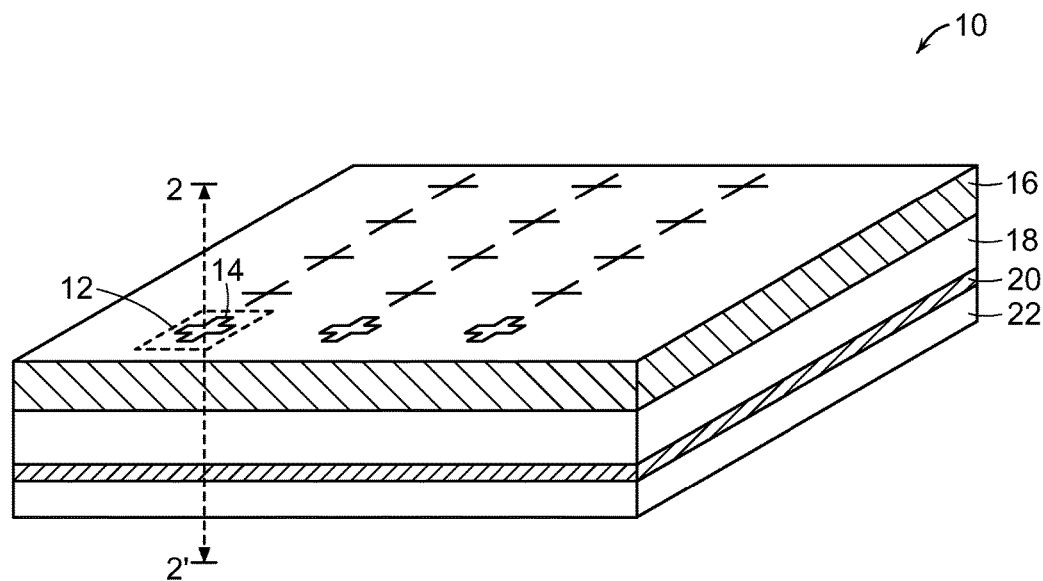
FIG. 1 is an isometric view of a metamaterial.
Figure 2:
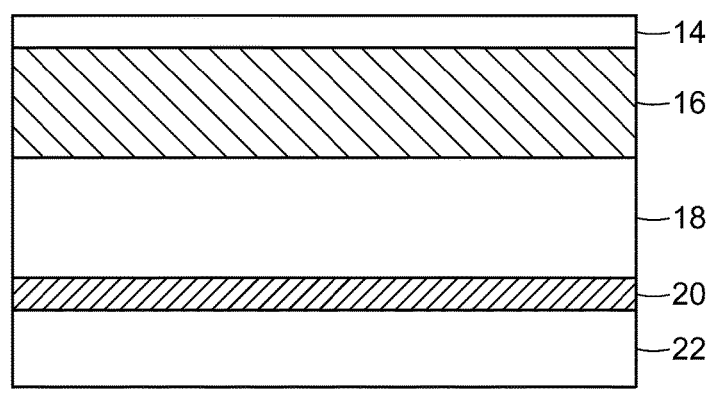
FIG. 2 is a cross-section through a unit cell in FIG. 1.

Referring to FIG. 1, and the cross-section thereof shown in FIG. 2, a metamaterial 10 comprises plural unit cells 12, each of which includes an electromagnetic coupling element 14. In the particular embodiment disclosed, the electromagnetic coupling element 14 is a crossed dipole. This configuration results in a polarization-insensitive metamaterial 10. However, the coupling element 14 can be any suitable structure. Examples of coupling elements 14 include as split ring resonator, electrical split ring resonator, spiral, and log spiral, electrical split ring resonators, double electric split ring resonators, bow tie antennas, coils, spiral antennas, and log periodic antennas In one embodiment, the crossed dipole is made of strips having an average length of 5.9 mm and an average width of 0.65 mm for use in a unit cell 12 having sides with length 7.2 mm. This is particularly suitable for a metamaterial 10 designed to operate in the X band (8-12 GHz), and in particular, at 9.5 GHz. However, the structure is electromagnetically scalable and can thus be configured to be tuned to any band of frequencies, from the kilohertz range, through the terahertz range and on into the far infrared.

The coupling element 14 is applied by masking a paint layer 18 with a stencil 16. The stencil 16 is temporarily attached to the paint layer 18 with mounting spray. A conductive ink is then applied to form a pattern. Although a variety of conductive inks, such as nickel ink and carbon ink can be used, the preferred ink is a silver ink normally used to prepare specimens in scanning electron microscopy. To achieve the desired thickness, two or more coats of silver ink are applied, with a brief drying time between coats.

In one embodiment, the total thickness of the silver ink is between 12 and 20 micrometers. This can be made by brushing on two coats of ink with a drying time of ten minutes at standard temperature and pressure between coats. This results in the desired thickness while permitting the mask to be easily removed without harming the pattern. The stencil 16 in this embodiment is approximately 3.5 millimeters thick. A suitable material for the stencil 16 is ordinary copy paper. However, the stencil 16 can also be made of textiles.

The paint layer 18 is preferably made of latex paint. However, oil-based paints can also be used, as can polymers that can be brushed onto a substrate and built up layer by layer to a desired thickness. The availability of paint in multiple colors provides the possibility of color matching the metamaterial 10 to its surroundings, thus facilitating its use in, for example, automobiles where aesthetic considerations are important, or as camouflage in military applications.

Other examples of paints include dispersions of different materials with different properties, including colloidal dispersions of nanoparticles, including, without limitation, gold, nickel, iron, cobalt, and various oxides. Other examples are colloidal dispersions of nanowires, including gold, silver, nickel, or other metallic nanowires, and dispersions of nanoplatelets, such as graphene, graphene oxide, reduced graphene oxide, metal oxides such as $MoS_2$ etc in water or any suitable liquid.

The paint layer 18 in one embodiment is about 1 mm thick. This can be achieved by applying about 30 coats of latex paint. A paint layer 18 of suitable thickness can also be made by painting on Teflon, letting the paint dry, scoring the paint into appropriate sized pieces, peeling them off, and then stacking them to attain the desired thickness, using fresh paint as a glue to hold the structure together. This offers the advantage of speed since one no longer has to wait for each coat of paint to dry.

In some cases, multiple paint layers can be used. For example, one can alternate between dielectric paint layers and conductive paint layers. Or one can pattern electromagnetic coupling elements 14 on a first paint layer and then build a second paint layer on top of the first paint layer, effectively sandwiching the electromagnetic coupling elements between two paint layers. This procedure can be repeated so that the completed metamaterial can have multiple paint layers with various coupling structures at the interfaces formed between them.

To enhance structural integrity, it is useful to include some reinforcing material in the paint used to build a paint layer 18. For example, one can mix shredded paper or some other solid material to form a structurally stronger paint layer 18.

The paint layer 18 is placed on a conductive backplane 20. This conductive backplane 20 can be made by painting silver ink on a substrate 22, such as a PET film. For X band applications, the backplane 20 is about 12-20 micrometers thick. Once the patterning is completed, the backplane 20 can be separated from the substrate 22. This results in a flexible metamaterial that can easily be mounted on a curved surface.

Figure 3:
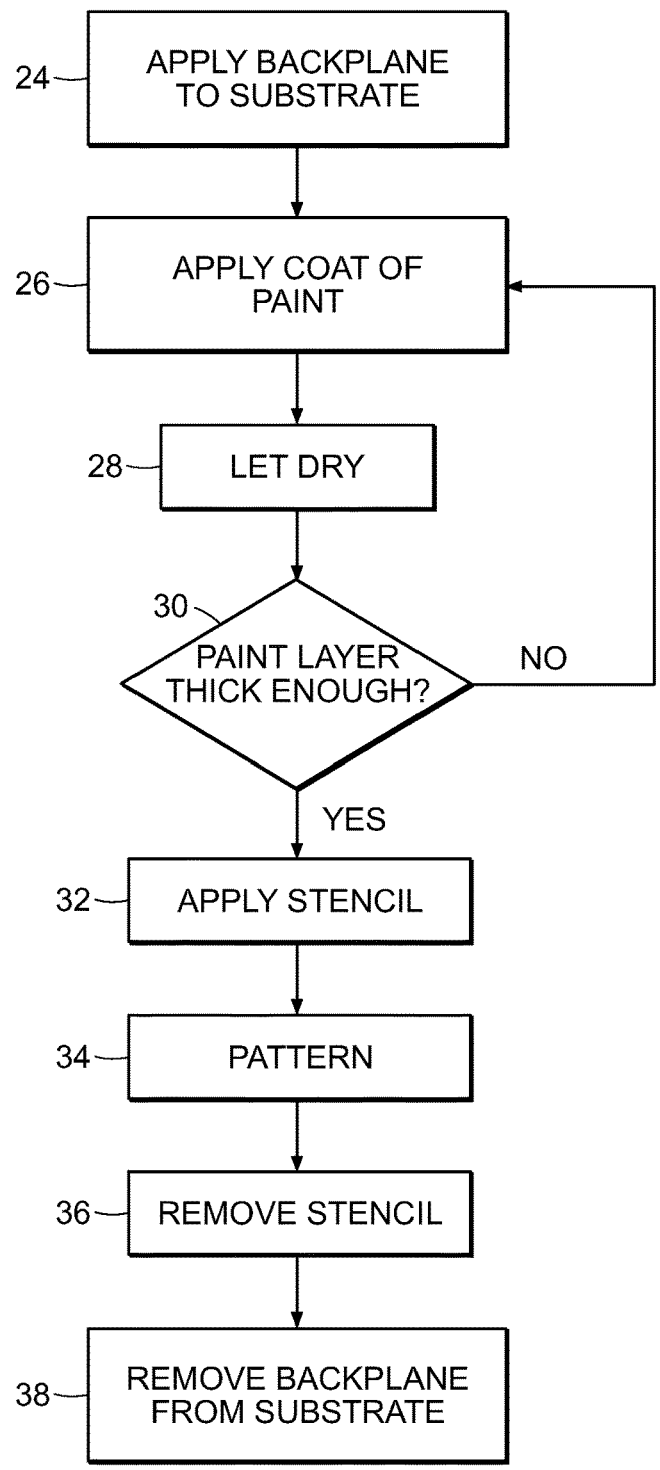
FIG. 3 is a flow-chart for a method of making the metamaterial in FIGS. 1 and 2.

Referring to FIG. 3, a method 23 of making a metamaterial includes applying a conductive backplane to a substrate (step 24). This can be done by painting silver ink on a PET substrate. This is followed by building a paint layer, which includes applying a coat of paint to the backplane (step 26), letting the plaint dry (step 28) and determining if the paint layer is thick enough (step 30). If the paint layer is not thick enough, another coat of paint is applied (step 26) and allowed to dry (step 28). If the paint layer is thick enough, a stencil is applied onto the paint layer (step 32). The paint layer is then patterned with unit cells through the stencil (step 34). This is followed by removal of the stencil from the paint layer (step 36) and removal of the backplane from the substrate (step 38).

Figure 4:
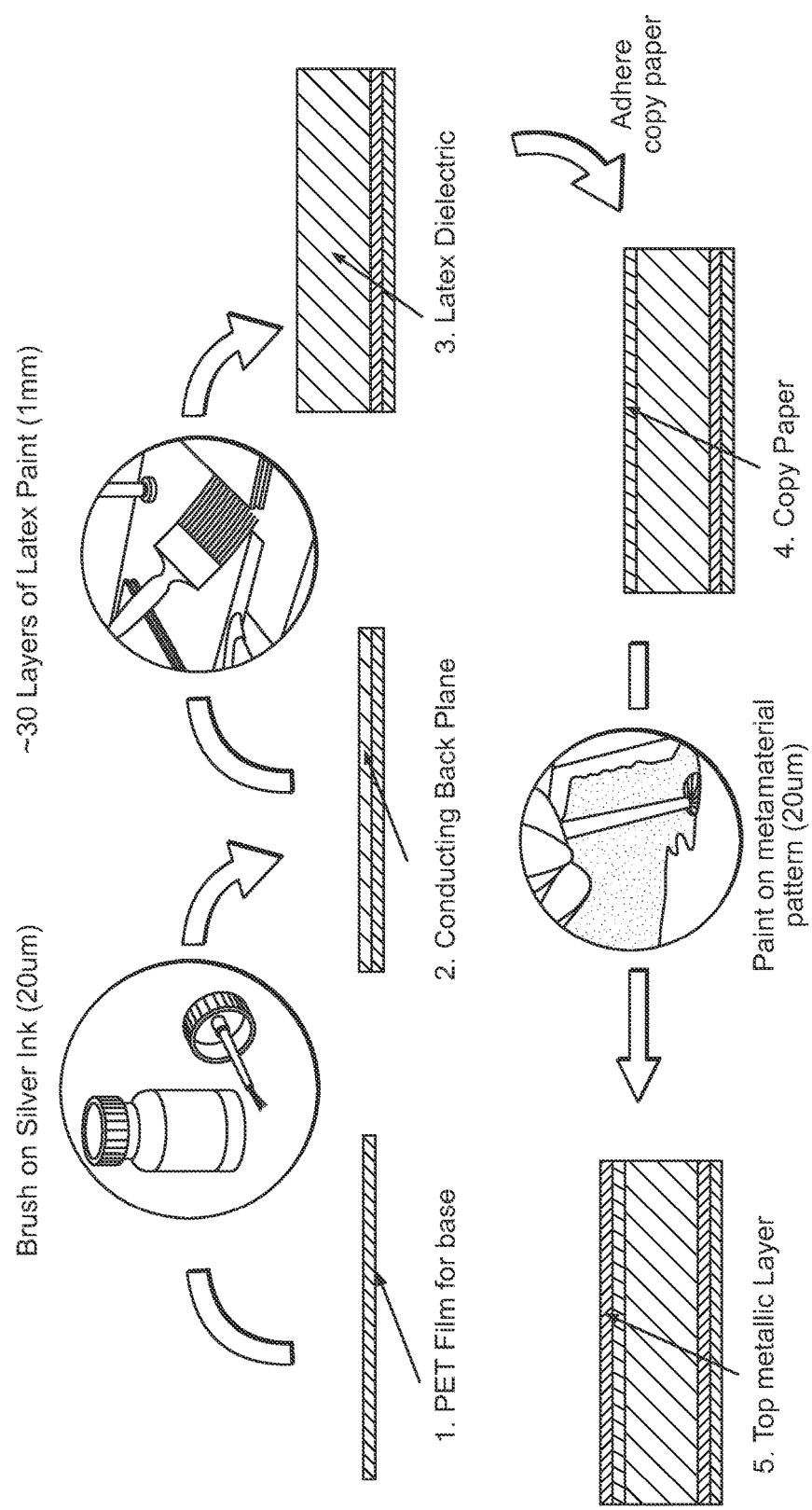
FIG. 4 shows the metamaterial during the various steps in FIG. 3.

FIG. 4 shows the metamaterial in the process of being constructed beginning with a PET used as base material (step 1). This base material is peeled of after fabrication is finished. The PET sheet is painted with three layers of silver conductive paint to a thickness of 20 micrometers (step 2) to form a conductive backplane. Then, a 1 mm thick coat of (latex paint-quick dry, durable, flexible) substrate is used for the absorber fabrication. About 30 coats of paint was applied to reach 1 mm thickness (step 3). Between each coast, the paint was allowed to dry for 10-20 minutes. A paper-based stencil was then laid on (step 4) and conductive silver paint is applied on stencil covered paint substrate. The stencil was then removed after paint was dried for 10-20 mins (step 5).

A metamaterial 10 as described herein is particularly useful for the use of electromagnetic waves in connection with collision avoidance between motor vehicles, and automated maneuvering and piloting of motor vehicles. In such applications, it is desirable to manipulate the surfaces of the vehicles to avoid specular reflections or to otherwise have electromagnetic characteristics that enhance the reliability of radar systems used in such applications.

Metamaterials 10 as described herein are also useful for radar absorption and can therefore be used to reduce radar cross-sections of vehicles that may be targeted by radar, such as drones, military aircraft, ships, and missiles.

Metamaterials 10 as described herein can be made frequency selective. As such, they are suitable for use in radomes and other structures for which it is desirable to pass certain frequencies but to exclude others.

The foregoing methods also permit construction of multi-layered 3D structures with metallic and dielectric patterns of precise dimensions dictated by the size of the stencil. In addition to making antennas and metamaterials, such structures can include devices, sensors, circuits or systems that have traditionally been micro-fabricated or printed.

Figure 5:
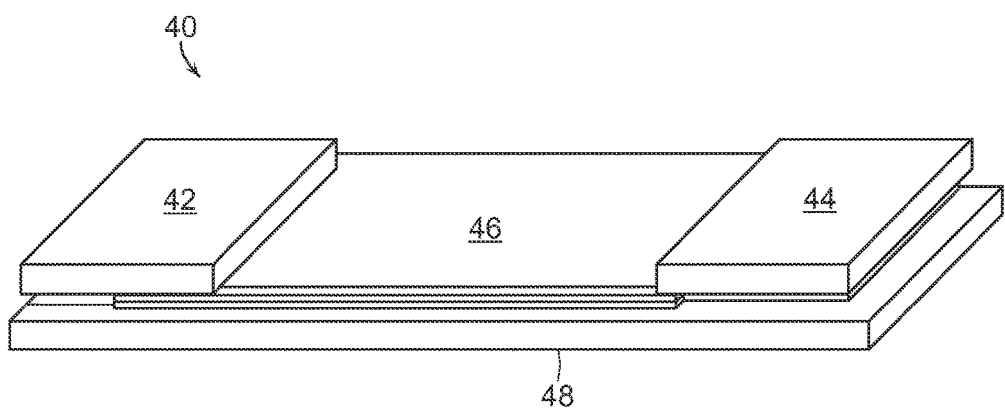
FIG. 5 shows a sensor constructed according to the methods based on the procedure shown in FIG. 3.

FIG. 5 shows a chemical gas or vapor sensor 40 formed by painting electrodes 42, 44 from metallic paint, and in between the electrodes 42, 44, painting a sensor region 46 made of a chemically sensitive material on top of a substrate 48.

One example of a chemically sensitive material is a dispersion of carbon nanotubes. Carbon nanotubes or reduced graphene oxides are particularly sensitive to vapors, including those arising from volatile organic compounds.

Instead of micro-patterning in a clean-room, or using a complicated assembly process, one can simply paint these various materials on any arbitrary substrate, including a curved substrate, a flexible substrate, or a hard substrate, to make various electrically active structures.

The sensor 40 shown in FIG. 5 represents just one of many possible structures that could be made using the methods described herein. For example, one can also paint on photovoltaic materials for energy harvesting. Additionally, one could paint a p-type and n-type, stacked side to side or even vertically to make multi junction solar cells. Devices made with a paint having piezoelectric properties can also be used. Such devices could harvest energy from motion.

Yet another application is the painting of an electrode array for biomedical applications. One example of such an electrode arrays is one that is disposed to apply or receive electrical signals. Such arrays can be used for both stimulation and diagnosis. Examples of such arrays are those that interact with the spinal cord in rehabilitation prosthetic devices. Another example of such arrays are those that can be used to record EEG signals from brain. Yet another example of such arrays are those that can be used to record ECG signals from heart.

In addition, one can use the foregoing methods to fabricate conventional electronic devices, such as diodes and transistors. For example, one can form a transistor with metallic paints for gates, source and drain terminals, and then semiconductor paint, such as using the dispersion of semiconducting carbon nanotubes, or graphene, suitably doped, to create the underlying structure.

Having described the invention, and a preferred embodiment thereof, what we claim as new, and secured by Letters Patent is:

1. A manufacture comprising a substrate having an electromagnetic metamaterial disposed thereon, wherein said electromagnetic metamaterial comprises a set of stacked paint layers and a plurality of electromagnetic coupling elements, wherein said electromagnetic coupling elements are disposed throughout said set, wherein said set of stacked paint layers comprises a dielectric paint layer and a conductive paint layer, wherein said dielectric paint layer and said conductive paint layer define a stack of two paint layers, wherein said conductive paint layer comprises a conductive patterned structure, wherein said conductive patterned structure comprises an array of said electromagnetic coupling elements, and wherein a paint layer selected from the group consisting of said dielectric paint layer and said conductive paint layer is on said substrate.

2. The manufacture of claim 1, wherein said manufacture is a sensor.

3. The manufacture of claim 1, wherein said dielectric paint layer comprises latex paint.

4. The manufacture of claim 1, wherein said dielectric paint layer comprises an oil-based paint.

5. The manufacture of claim 1, wherein said dielectric paint layer comprises a water-based paint.

6. The manufacture of claim 1, wherein said dielectric paint layer comprises a polymer.

7. The manufacture of claim 1, wherein said substrate comprises a vehicle on which said electromagnetic metamaterial is applied.

8. The manufacture of claim 1, wherein said substrate comprises a curved surface on which said electromagnetic metamaterial is applied.

9. A method specially adapted for the manufacture of manufacture comprising a substrate having an electromagnetic metamaterial disposed thereon, wherein said electromagnetic metamaterial comprises a set of stacked paint layers and a plurality of electromagnetic coupling elements, wherein said electromagnetic coupling elements are disposed throughout said set, wherein said set of stacked paint layers comprises a dielectric paint layer and a conductive paint layer, both of which are paint layers that are elements of said set of stacked paint layers, wherein said conductive paint layer comprises a conductive patterned structure, wherein said conductive patterned structure comprises an array of electromagnetic coupling elements, and wherein a paint layer selected from the group consisting of said of said dielectric paint layer and said conductive paint layer is on said substrate, said method comprising applying a backplane onto said substrate, building a first paint layer on said backplane, said first paint layer being one of said dielectric paint layer and said conductive paint layer, wherein said first paint layer, after having been built, becomes one of said paint layers in said set of stacked paint layers, applying a stencil on said first paint layer, patterning said electrically active element onto said first paint layer through said stencil, and removing said stencil.

10. The method of claim 9, wherein building said first paint layer comprises applying a plurality of coats of paint.

11. The method of claim 9, further comprising building a second paint layer on top of said patterned first paint layer.

12. The method of claim 9, wherein building said first paint layer comprises mixing a reinforcing agent into paint used to build said first paint layer.

13. The method of claim 9, wherein building said first paint layer comprises mixing shredded paper into paint used to build said first paint layer.

14. The method of claim 9, wherein patterning said element comprises applying conductive ink onto said stencil layer.

15. The method of claim 9, further comprising removing said substrate.

* * * * *